United States Patent
Yong

(10) Patent No.: US 9,515,601 B2
(45) Date of Patent: Dec. 6, 2016

(54) SOLAR CELL MODULE AND SYSTEMS INCORPORATING SAME

(71) Applicant: iTouch Energy Limited, Belfast (GB)

(72) Inventor: KianPeng Yong, Newtownabbey (GB)

(73) Assignee: iTouch Energy Limited, Belfast (GB)

( * ) Notice: Subject to any disclaimer, the term of this patent is extended or adjusted under 35 U.S.C. 154(b) by 0 days.

(21) Appl. No.: 14/399,357

(22) PCT Filed: May 8, 2013

(86) PCT No.: PCT/EP2013/059605
§ 371 (c)(1),
(2) Date: Nov. 6, 2014

(87) PCT Pub. No.: WO2013/167660
PCT Pub. Date: Nov. 14, 2013

(65) Prior Publication Data
US 2015/0096607 A1    Apr. 9, 2015

(30) Foreign Application Priority Data

May 9, 2012 (GB) .................................. 1208104.8

(51) Int. Cl.
*H02N 6/00* (2006.01)
*H01L 31/042* (2014.01)
(Continued)

(52) U.S. Cl.
CPC ......... *H02S 40/34* (2014.12); *H01L 31/02008* (2013.01); *H01L 31/048* (2013.01);
(Continued)

(58) Field of Classification Search
CPC ...... H02S 40/34; H02S 40/36; H01L 31/0481; H01L 31/05; H01L 31/0504; H01L 31/0508
See application file for complete search history.

(56) References Cited

U.S. PATENT DOCUMENTS

| 7,713,089 | B2 * | 5/2010 | Faust | ................ H01L 31/02008 |
| | | | | 136/251 |
| 2008/0291706 | A1 * | 11/2008 | Seymour | ............... H02M 1/126 |
| | | | | 363/40 |

(Continued)

FOREIGN PATENT DOCUMENTS

| DE | 10317020 A1 | 11/2004 |
| WO | 2010084293 A2 | 7/2010 |

OTHER PUBLICATIONS

International Search Report for PCT/EP2013/059605, mailed Jul. 30, 2013, 4 pages.
International Preliminary Report on Patentability for PCT/EP2013/059605, issued Nov. 11, 2014, 5 pages.

*Primary Examiner* — Eli Mekhlin
(74) *Attorney, Agent, or Firm* — Withrow & Terranova, P.L.L.C.

(57) ABSTRACT

An electrical connection system comprising a plurality of electrical components electrically interconnected by a plurality of multi-terminal electrical connector devices. Each electrical component has first and second electrical terminals, each connector device having a plurality of electrical terminals arranged in first and second rows each row comprising a plurality of said terminals. One row is positioned along one side of the connector, the other row being positioned along the other side of the connector. First and second of the connector terminals are electrically connected to a respective one of the first and second terminals of a respective one of the electrical components. Each connector device is configurable such that its terminals may adopt a selected one of a plurality of terminal configurations.

18 Claims, 14 Drawing Sheets

(51) Int. Cl.
*H02S 40/34* (2014.01)
*H01L 31/05* (2014.01)
*H01L 31/02* (2006.01)
*H01L 31/048* (2014.01)
*H02S 40/36* (2014.01)

(52) U.S. Cl.
CPC .............. *H01L 31/05* (2013.01); *H02S 40/36* (2014.12); *Y02E 10/50* (2013.01)

(56) References Cited

U.S. PATENT DOCUMENTS

| | | | |
|---|---|---|---|
| 2011/0048656 A1* | 3/2011 | Chu | E06B 9/28 160/310 |
| 2011/0140528 A1 | 6/2011 | Pasi et al. | |
| 2012/0013191 A1* | 1/2012 | Jeandeaud | H02S 40/34 307/80 |

* cited by examiner

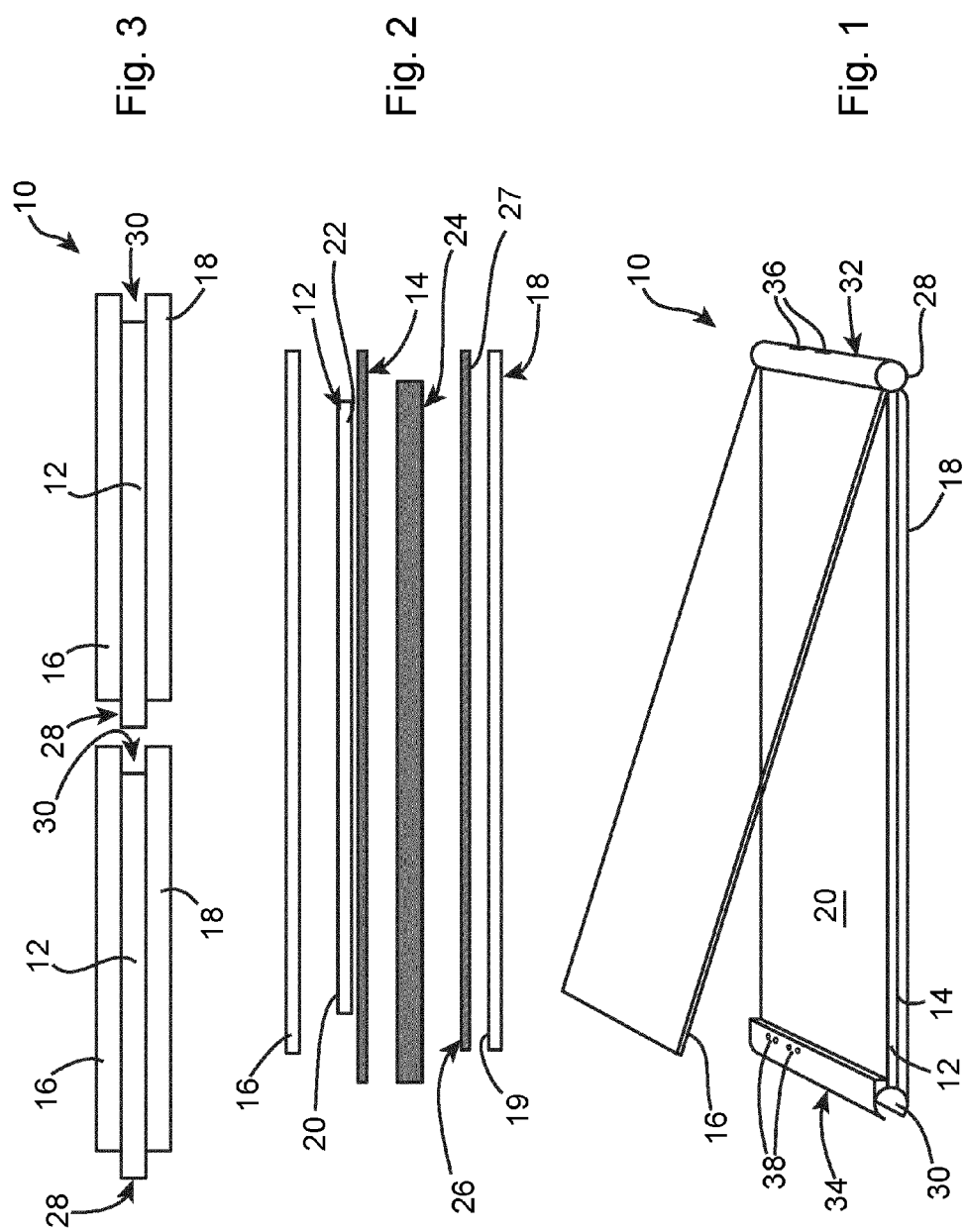

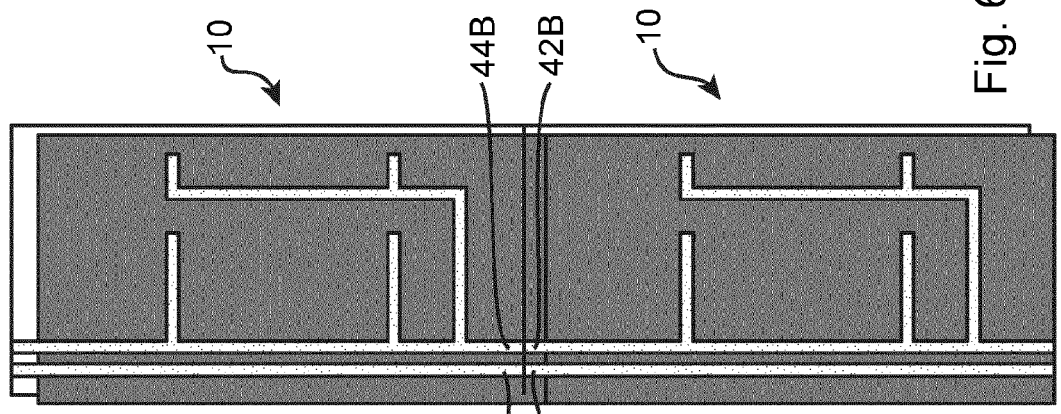
Fig. 6
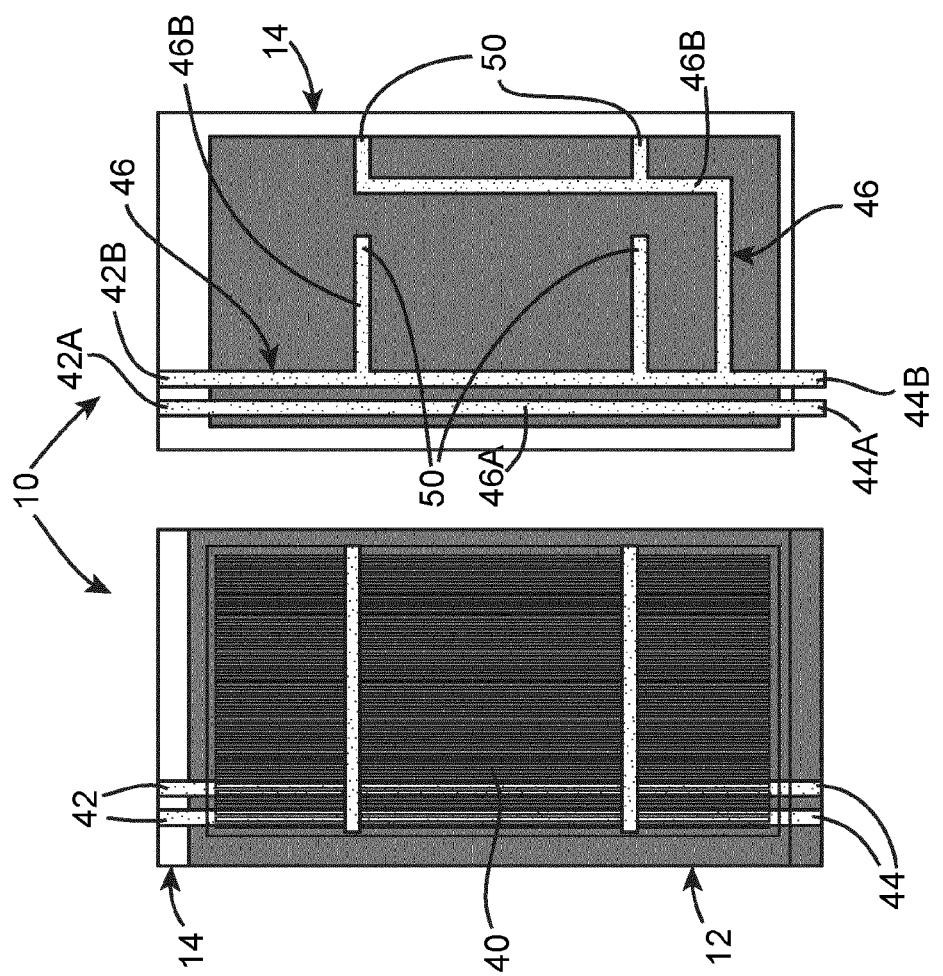
Fig. 5
Fig. 4

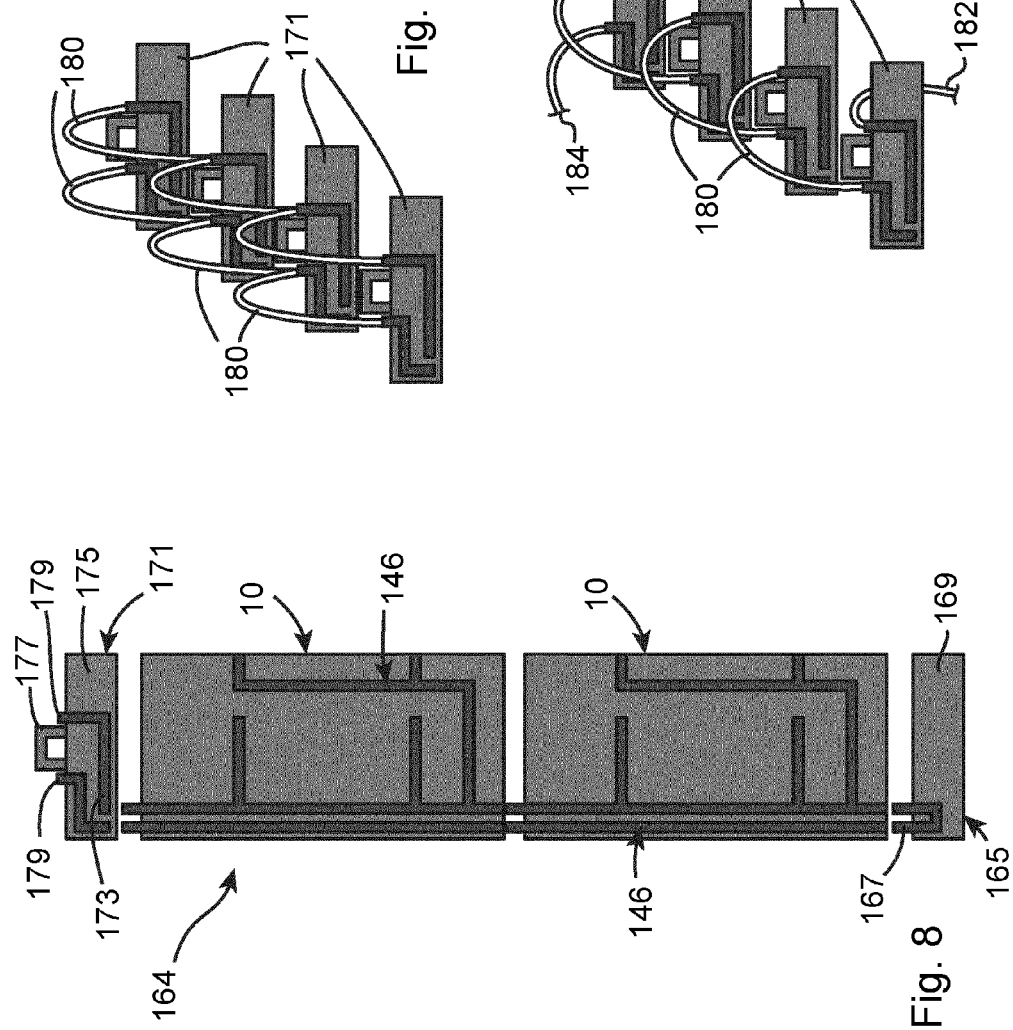

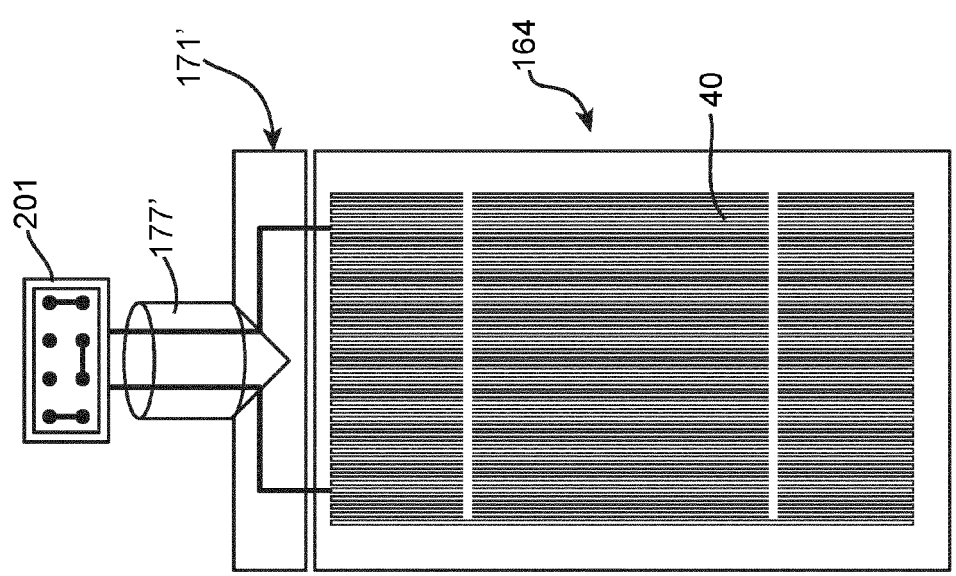

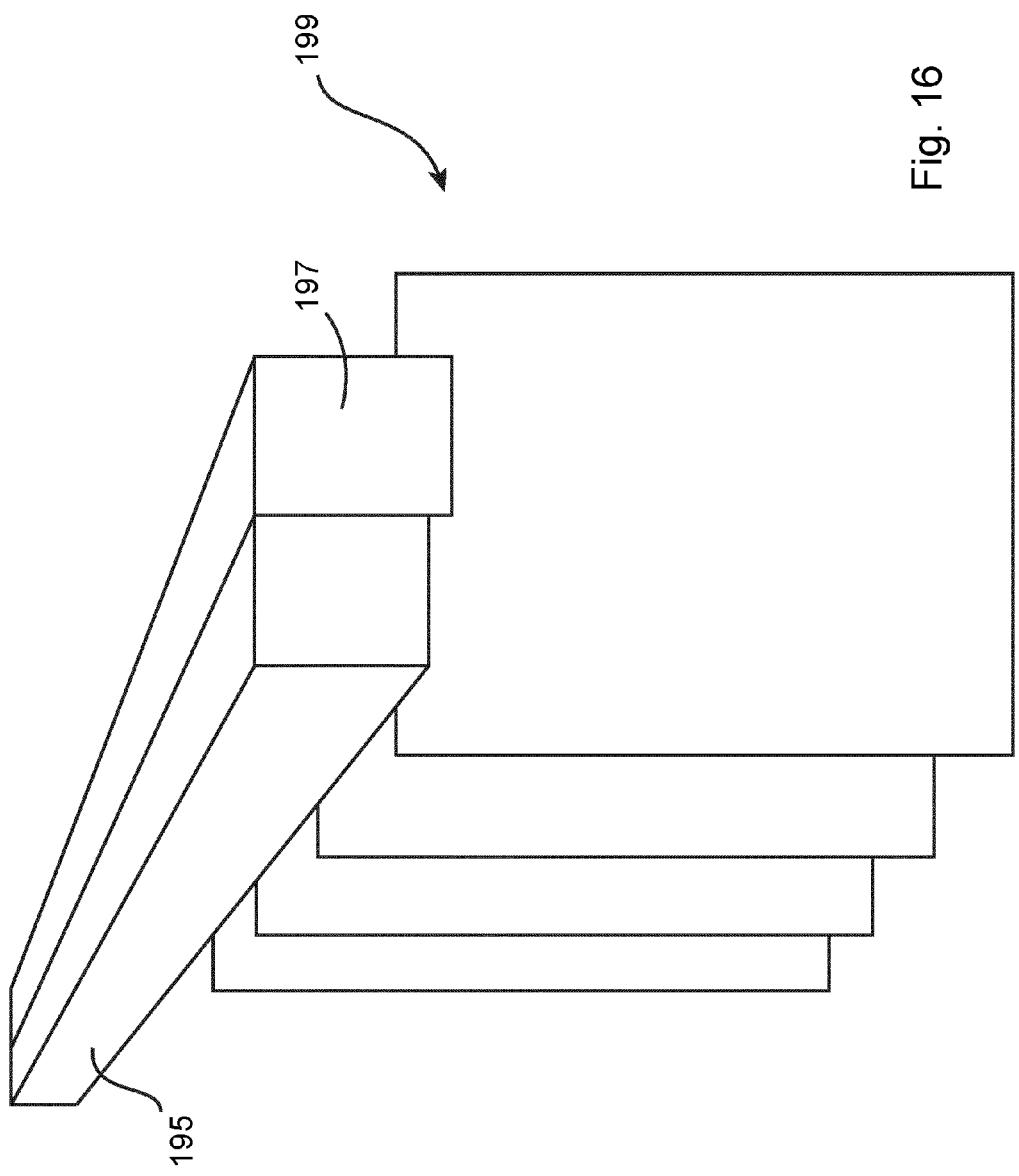

SOLAR CELL MODULE AND SYSTEMS INCORPORATING SAME

This application is a 35 USC 371 national phase filing of International Application No. PCT/EP2013/059605, filed May 8, 2013, which claims priority to United Kingdom patent application 1208104.8, filed May 9, 2012, the disclosures of which are incorporated herein by reference in their entireties.

FIELD OF THE INVENTION

The present invention relates to electrical connection systems and particularly but not exclusively solar cells and to systems incorporating solar cells.

SUMMARY OF THE INVENTION

A first aspect of the invention provides a solar cell module comprising a solar panel interposed between a front panel and a rear panel, and at least one mechanical connector suitable for releasably connecting said module to other instances of said solar cell module and/or other components having a compatible mechanical connector.

Typically, the module includes at least two mechanical connectors spaced apart and preferably oppositely located on the module for connecting the module other instances of said solar cell module and/or other components having a compatible mechanical connector. Said at least two mechanical connectors are preferably located at opposite ends or sides of the module. Said at least two mechanical connectors preferably comprise first and second co-operable mechanical connectors, e.g. a male connector and a corresponding female connector.

The module typically includes electrical circuitry configured to enable electrical interconnection of the module with one or more like modules or other components, and conveniently also to allow electrical connection to the solar panel to receive electrical current generated by the panel in use. The circuitry is conveniently provided in an electrical circuit layer, preferably between the solar panel and the rear panel.

The preferred module is provided with at least two electrical connectors for electrically connecting said electrical circuitry to an external electrical circuit, for example the respective electrical circuitry of another one or more of said modules. In the preferred embodiment, the module is provided with first and second pairs of electrical connectors, each pair being suitable for use as a respective positive and negative electrical terminal pair. Advantageously, at least one of the electrical connectors, and in the preferred embodiment a respective pair of electrical connectors, is co-located with a respective mechanical connector and configured such that, when the mechanical connector is connected to a corresponding other mechanical connector the respective electrical connectors make an electrical connection.

In preferred embodiments, the electrical circuitry and solar panel are substantially electrically isolated from the external environment. To this end, at least one layer, e.g. the front and rear panels, on either side of the circuitry and solar panel are preferably formed form an electrically insulating material. The front panel is preferably transparent to allow solar radiation to reach the solar panel.

A second aspect of the invention provides an electrical solar power generator comprising a plurality of said solar cell modules mechanically and electrically releasably interconnected.

A third aspect of the invention provides a vane for a blind, said vane comprising at least one of said electrical solar power generators, and preferably including a mechanical connector for connecting said vane to a head rail. Advantageously, said mechanical connector is adapted to receive internally the electrical connections to and from the or each vane.

A fourth aspect of the invention provides a blind comprising at least one by typically a plurality of said vanes connected to a head rail.

A fifth aspect of the invention provides an electrical power generating system suitable for connection to an electrical power distribution system, for example an electrical grid, the system including at least one solar electrical power generator, the or each generator comprising at least one, but typically a plurality of, said solar cell modules. Typically, the or each generator is electrically connected to the power distribution system via an inverter, for example a grid-interactive inverter. In preferred embodiments, the or each solar power generator comprises a blind vane connected to a head rail, said head rail carrying a housing for said grid-interactive inverter.

In preferred embodiments, the system includes a plurality of sets of one or more generators, each generator in a set being connected electrically in series with each other generator in the set, or being connected electrically in parallel with each other generator in the set, each set being connected electrically in series with one or more other sets, and/or in parallel with one or more other sets. Advantageously, the electrical connection between at least some generators and/or between at least some sets of generators is configurable to change a series connection to a parallel connection, or a parallel connection to a series connection. In preferred embodiments, a controller is configured to control said electrical connections, e.g. by any suitable switching means. The controller is advantageously configured to monitor one or more system parameters and to set said electrical connections accordingly. The system parameters may include a measure of the amount of solar energy being received by the generators and/or an indication of the voltage level and/or current level being produced by the or each (individually and/or combined) generator. Depending on the determined level of solar energy being received, the controller may be arranged to set said electrical connections to increase or decrease the voltage or current being produced, individually and/or in combination, by the generators. Alternatively, or in addition, depending on the determined level of voltage and/or current being produced by the or each (individually and/or combined) generator, the controller may be arranged to configure said electrical connections to increase or decrease the voltage or current being produced, individually and/or in combination, by the generators.

A sixth aspect of the invention provides a multi-terminal electrical connector device for electrically connecting an electrical component (especially but not exclusively said solar electrical power generators or said solar cell modules) to one or more other electrical components each component having first and second electrical terminals, the connector device having at least eight electrical terminals, preferably arranged in first and second rows of four, the rows preferably being aligned with one another. Most conveniently, the terminals are arranged in a substantially rectangular two-dimensional array, one row being positioned along one side of the connector, the other row being positioned along the other side of the connector. The preferred arrangement is such that when said connectors are positioned adjacent one another, the first row of one connector is adjacent the second row of another connector.

In the preferred embodiment, first and second of said terminals are electrically connected, in use, to a respective one of the first and second terminals of the respective electrical component. In the preferred embodiment, the first terminal of the connector is provided in the first row and the second terminal is provided in the second row. Advantageously, the terminals are not aligned with one another, i.e. do not occupy the same row position. Preferably, they are offset from one another by one row position. Most preferably, the terminals occupy a respective one of the two mid-row positions.

In preferred embodiments, the connector device is configurable such that its terminals may adopt a selected one of a plurality of terminal configurations. In a first configuration the terminals that occupy the mid-positions of the second row are electrically connected, respectively, to the terminals that occupy the closest end position of the first row. In a second configuration the terminals that occupy the mid-positions of the first row are electrically connected, respectively, to the terminals that occupy the closest end position of the second row, and the terminals that occupy the mid-positions of the second row are electrically connected together. In a third configuration the terminals that occupy the mid-positions of the second row are electrically connected together, and the terminals occupying the end positions of one row are electrically connected to a respective one of the terminals occupying the adjacent, or closest, end positions of the other row. In a fourth terminal configuration two terminals from one row are electrically connected to the respective terminal in the other row that occupies the same terminal position and, preferably, the terminals occupying the two mid-positions of each row are connected.

In preferred systems embodying the invention, a respective connector device is associated with each generator (or other electrical component) and connector devices of adjacent generators (or other electrical components) are electrically interconnected by electrically connecting the respective terminals of one row of one of the connector devices with the respective terminal of the other row of the adjacent connector device having the corresponding row position. The connector devices may be configured to adopt a selected terminal configuration to configure the generators in a desired series and/or parallel electrical configuration.

Said system may include one or more sets of more than one interconnected generators each having a connector device with said third configuration, said generators being connected in series electrically.

Preferred systems include at least one set of interconnected generators including a first generator having a connector device with said first terminal configuration and a second generator having a connector device with said second configuration and, optionally, one or more generators between said first and second generators, said one or more generators each having a connector device with said third configuration. In a preferred arrangement, the system includes at least one instance of a first and second of said sets arranged with the connector device of the second generator of the first set electrically connected to the connector device of the first generator of the second set. Advantageously, at least the connector device of the second generator of the first set and the connector device of the first generator of the second set are each selectably configurable to adopt said third terminal configuration. This allows the sets to selectively be connected in parallel, or all of the generators in each set to be connected in series.

The system may include one or more instances of first and second adjacent interconnected generators each having a connector with said fourth configuration, said generators being connected in parallel.

In some embodiments, configuration and re-configuration of the connectors may be performed manually, e.g. by appropriate manual configuration of the conductive links. Preferably, however, each connector device is co-operable with a switching apparatus (conveniently a respective switching apparatus) for effecting configuration and reconfiguration of inter-terminal connections of the connector device.

In preferred embodiments, a controller is configured to control the configuration of at least some of the connector devices, e.g. by means of said switching apparatus. The controller is advantageously configured to monitor one or more system parameters and to set the configuration of one or more connector devices accordingly. The system parameters may include a measure of the amount of solar energy being received by the generators and/or an indication of the voltage level and/or current level being produced by the or each (individually and/or combined) generator. Depending on the determined level of solar energy being received, the controller may be arranged to configure one or more connector devices to increase or decrease the voltage or current being produced, individually and/or in combination, by the generators. Alternatively, or in addition, depending on the determined level of voltage and/or current being produced by the or each (individually and/or combined) generator, the controller may be arranged to configure one or more connector device to increase or decrease the voltage or current being produced, individually and/or in combination, by the generators.

In preferred embodiments, said electrical circuitry of said solar cell modules is configured such that interconnected modules are electrically connected in series. Optionally, said generator may comprise a connector module configured to connected mechanically and electrically between adjacent solar cell modules, said connector module being electrically configured to electrically connect said adjacent solar cell modules, or respective set of adjacent solar cell modules, in parallel. A respective connector module may be connected on one or both sides of the or each solar cell module or set of solar cell modules as required. The connector modules may be configurable, e.g. under control of said controller, to selectively cause a parallel or series connection to be established between said adjacent solar cell modules, or respective set of adjacent solar cell modules.

Other preferred features are recited in the dependent claims.

Further advantageous aspects of the invention will be apparent to those ordinarily skilled in the art upon review of the following description of specific embodiments and with reference to the accompanying drawings.

BRIEF DESCRIPTION OF THE DRAWINGS

Embodiments of the invention are now described by way of example and with reference to the accompanying drawings in which like numerals are used to indicate like parts and in which:

FIG. 1 is a perspective view of a solar cell module embodying a first aspect of the invention;

FIG. 2 is an exploded side view of multiple layers that may be provided in the module of FIG. 1;

FIG. 3 is a simplified side view of two solar cell modules embodying the first aspect of the invention;

FIG. 4 is a plan view of a solar cell module embodying the first aspect of the invention;

FIG. 5 is a plan view of the solar cell module of FIG. 4 with a solar panel removed;

FIG. 6 is a plan view of two of the modules of FIG. 5 interconnected;

FIG. 8 is a plan view of a plurality of modules of the first aspect of the invention incorporated into a blind vane embodying a further aspect of the invention;

FIG. 9 is a schematic illustration of how a plurality of the blind vanes of FIG. 8 may be electrically interconnected in parallel;

FIG. 10 is a schematic illustration of how a plurality of the blind vanes of FIG. 8 may be electrically interconnected in series;

FIG. 15 is a schematic view of the blind vane of FIG. 8 including a preferred top block;

FIG. 16 is a schematic view of a blind including a grid interactive inverter incorporated into a head rail;

DETAILED DESCRIPTION OF THE DRAWINGS

Figure 7:
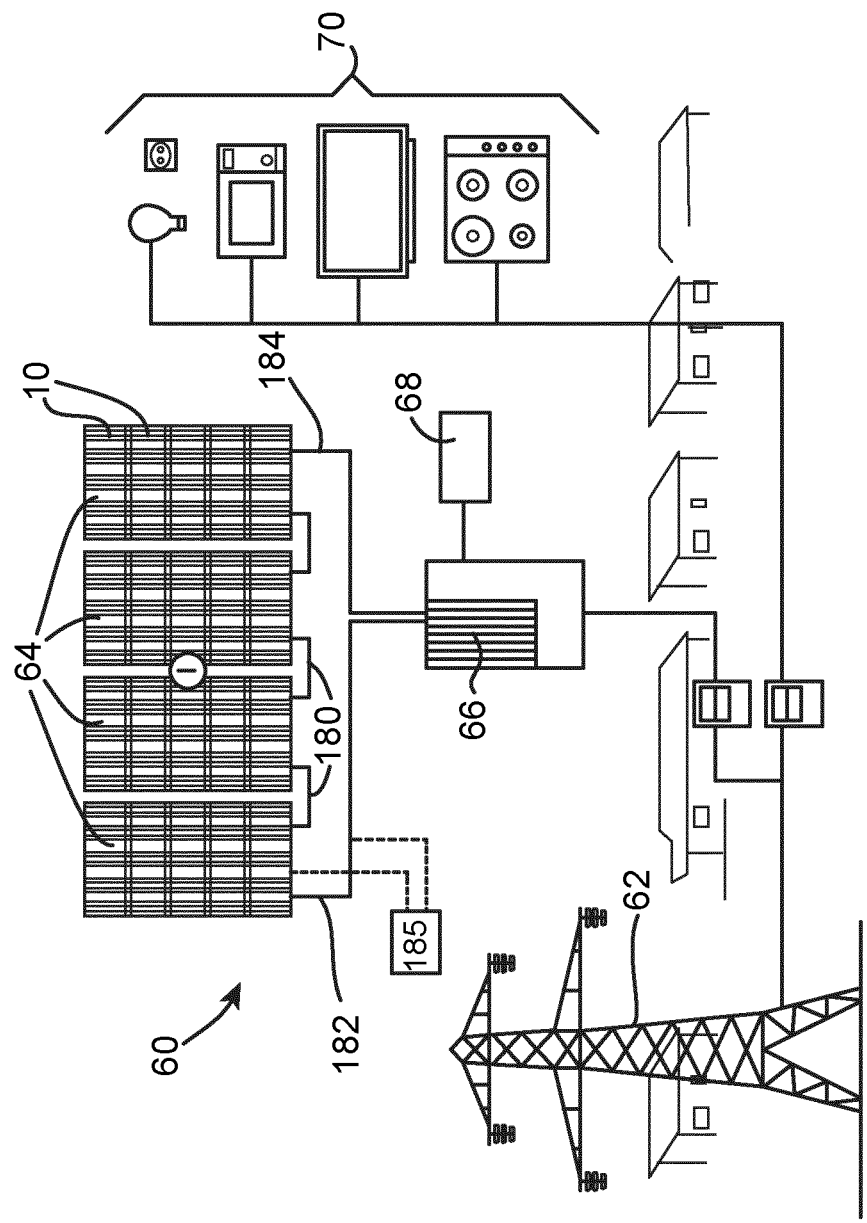
FIG. 7 is a schematic view of an electrical power generating system embodying another aspect of the invention and incorporating solar modules embodying the first aspect of the invention.

Referring now to FIGS. 1 and 2 of the drawings there is shown a solar cell module 10 embodying one aspect of the invention. The module 10 comprises a substantially planar, multi-layered structure including a solar panel 12 and an electrical circuit layer 14 interposed between a front panel 16 and a rear panel 18. The solar panel 12 comprises at least one solar cell (also known as a photovoltaic cells) which, in use, converts solar energy into electrical power. The solar cell is configured so that solar energy is absorbed at an obverse face 20 of the solar panel 12. The electrical circuit layer 14 comprises electrical circuitry carried by a suitable substrate, e.g. a PCB, and configured to enable electrical interconnection of the module 10 with one or more like modules or other components, and to allow electrical connection to the solar panel 12 to receive electrical current generated by the panel 12 in use. The electrical circuit layer 14 is conveniently located adjacent the reverse face 22 of the solar panel 12. It will be understood that the electrical circuitry may be provided in any other convenient manner and need not necessarily be incorporated into a separate layer or substrate.

The front panel 16 is located adjacent the obverse face 20 of the solar panel 12 and is transparent to allow light to reach the solar panel 12. The front panel 16 may be made from any suitable material, conveniently plastics.

Optionally, a support layer 24 is provided between the solar panel 12 and the rear panel 18. The support layer 24 may for example be formed from polycarbonate.

Optionally, a decorative layer 26 is provided between the solar panel 12 and the rear panel 18, preferably adjacent the reverse face 19 of the rear panel 18. The rearward face 27 of the decorative layer 26 carries a pattern, image or other decoration (e.g. a coloured surface). The decorative layer 26 may be formed from any material suitable for serving as an image substrate, e.g. plastics, paper, card or cardboard. Alternatively, when the decorative layer 26 is not present, an image, pattern or other decoration may be provided on the rearward face of any component of the module 10 that is adjacent the rear panel 18, e.g. the support layer 24 or the circuit layer 14 as applicable.

In embodiments where an image, pattern or other decoration is provided adjacent the rear panel, the rear panel 18 is transparent and may be formed from any suitable material, e.g. plastics. Otherwise, the rear panel 18 may be opaque.

In preferred embodiments, a respective one of co-operable mechanical connectors 28, 30 is provided at first and second opposite ends 32, 34 of the module 10. Typically one connector 28 is a male connector and the other connector 30 is a corresponding female connector. Alternatively, or in addition, the mechanical connectors may provided at first and second opposite sides of the module 10. The arrangement is such that two or more of the modules 10, or other units with compatible connectors, can be releasably interconnected (mechanically) end-to-end or side-to-side as applicable.

The module 10 is also provided with at least two electrical connectors for electrically connecting its electrical circuitry to an external electrical circuit, especially the electrical circuitry of another module 10. In the preferred embodiment, the module 10 is provided with first and second pairs 36, 38 of electrical connectors, each pair being suitable for use as a respective positive and negative electrical terminal pair. Advantageously, at least one of the electrical connectors, and in the preferred embodiment a respective pair 36, 38 of electrical connectors, is co-located with a respective mechanical connector 28, 30 and configured such that, when the mechanical connector 28, 30 is connected to a corresponding other mechanical connector 30, 28, the respective electrical connectors 36, 38 make an electrical connection. Conveniently, the electrical connectors 36, 38 are incorporated into the respective mechanical connector 28, 30. Accordingly, when two or more modules 10 are mechanically interconnected, their respective electrical circuitry is electrically interconnected. It will be apparent that the module 10 may be mechanically and electrically connected to any other component having compatible mechanical and electrical connectors.

FIG. 3 shows a simplified representation of the module 10, showing the solar panel 12 located between the front and rear panels 16, 18, and with a respective one of a male and female connector 28, 30 located at each end.

Depending on the materials and thicknesses selected, any of the layers 16, 20, 14, 24, 27, 18 may be rigid, semi-rigid, flexible, resiliently deformable or non-resiliently deformable. The respective flexibility and/or resilience of the or each layer may be selected to provide a desired overall flexibility and/or resilience of the module 10.

In preferred embodiments, the electrical components and circuitry, e.g. the electrical circuit layer 14 and solar panel 12 are electrically isolated (except at the electrical connectors 36, 38) from the external environment. To this end, at least one layer, e.g. the front and rear panels 16, 18, on either side of the circuit layer 14 and solar panel 12 are preferably formed form an electrically insulating material. The module 10 may also include a respective electrically insulating end component at each end (comprising the respective mechanical connectors 32, 34 in the illustrated embodiment), and optionally a respective electrically insulating side component (not illustrated) at each side.

The preferred module 10 is substantially planar and is conveniently substantially rectangular in plan view. It will be understood that modules embodying the invention may take other shapes.

FIG. 4 shows a plan view of the obverse face 20 of the solar panel 12 on top of the circuit layer 14. FIG. 4 shows the solar cell 40 and respective pairs of electrical terminals 42, 44 at opposite ends of the module 10. The terminals 42, 44 are electrically connected to respective electrical connectors 36, 38 (not shown in FIG. 4).

FIG. 5 shows a plan view of an embodiment of the circuit layer 14 including electrical circuitry 46. The electrical circuitry 46 includes the electrical terminals 42, 44 and electrical terminals 50 for electrically connecting the solar panel 12 to the circuitry 46. In the preferred embodiment, the circuitry 46 includes a respective circuit segment 46A, 46B for connecting a respective corresponding terminal 42A, 44A and 42B, 44B from each pair. The terminals 50 are incorporated into one of the segments 46B such that the solar panel 12 is electrically connectable between a respective corresponding terminal 42B, 44B of each pair. As a result, the circuitry 46, including the solar panel 12, is configured to form part of an electrical circuit, where each segment 46A, 46B forms part of a respective circuit path. Hence, each terminal pair 42, 44 has a terminal of each polarity, positive and negative, the corresponding terminals 42A, 44A and 42B, 44B from each pair have the same polarity. In the illustrated embodiment, it is assumed that terminals 42A, 44B are negative terminals (and so may be considered to form part of a return path of the circuit together with segment 46A), while terminals 42B, 44B are positive terminals (and so form part of a load path of the circuit, together with the segment 46B and the solar panel 12, when connected). It will be understood that the opposite polarity could be adopted.

The circuitry 46 may be implemented by any suitable means, e.g. conductive wires and/or conductive tracks provided in or on an insulating substrate.

FIG. 6 shows two modules 10 mechanically and electrically connected together end-to-end. The respective terminal pairs 42 and 44 are connected together such that the respective circuit segments 46A, 46B are in series. It will be apparent that any number of modules 10 may be similarly interconnected to form a one dimensional array of modules 10 (end-to-end in the present example, but could be side-to-side in alternative embodiments). Alternative embodiments (not illustrated) may be configured (i.e. with appropriate circuitry and terminals) to be interconnected to create a two or three dimensional array of solar cell modules.

In order to complete an electrical circuit, the terminals 42, 44 at the ends of the array are connected to external circuitry, the nature of which is dependent on the application. In typical embodiments, the terminal pair 42 or 44 at one end of the array are electrically connected together, as is described by way of example hereinafter with reference to FIG. 8.

Referring now to FIG. 7, there is shown an electrical power generating system 60 embodying another aspect of the invention. The system 60 is suitable for connection to an electrical power distribution system, for example comprising an electrical grid, which is represented in FIG. 7 by pylon 62. The system 60 includes at least one solar electrical power generator 64, the or each generator 64 comprising at least one, but typically a plurality of, solar cell modules 10. The or each generator 64 is electrically connected to the power distribution system 62 in order to supply electrical power thereto. In FIG. 7, multiple generators 64 are shown and are electrically connected together to act as a single electrical power source for connection to the system 62. Typically, the solar generators 63 generate DC electrical power whereas the grid 62 requires AC electrical power. Accordingly, an inverter is provided for converting the DC power into AC power. Conveniently, the inverter comprises a grid-interactive inverter 66 (commonly referred to as a grid-tie inverter or a synchronous inverter). The grid-interactive inverter 66 is a preferred form of control unit for controlling power supply to the grid. Typically, the inverter 66 is configured to track the Maximum Power Point Tracking (MPPT) to optimise the feed in energy. Typically, a monitoring unit 68 is provided for monitoring the supply of power to the grid 62 via the inverter 66. Typically the monitoring unit is configured to monitor and preferably record the power generated by the generators 64.

As shown in FIG. 7, the grid 62 may supply electrical power to electrical devices 70. In alternative embodiments, the generators 64 may supply electrical power to the electrical devices 70 (in addition to, or instead of, supplying power to the grid 62, typically via an inverter (although not usually a grid-interactive inverter).

Referring now to FIG. 8, there is shown, in exploded view, an embodiment of a solar electrical power generator in the form of a vane 164 for a blind. The vane 164 comprises at least one, but typically a plurality of, solar cell modules 10, mechanically and electrically interconnected as described above. An end component 165 is provided at a free end of the vane 164 and comprises electrical circuitry 167 for interconnecting terminals 144 at the vane end. The end component 165 may take any suitable form, in this example comprising a body 169 carrying the circuitry 167 and isolating it from the external environment. The body 169 may include a mechanical connector (not shown) and electrical connectors (not shown) compatible with those provided on the module 10. A top component 171 provided at the, in use, top end of the vane 164 and comprises electrical circuitry 173 for connecting terminals 142 to an external circuit (not shown). The top component 171 may take any suitable form, in this example comprising a body 175 carrying the circuitry 173 and isolating it from the external environment. The body 169 may include a mechanical connector (not shown) and electrical connectors (not shown) compatible with those provided on the module 10 in order that it may be (releasably) connected to the vane 164. The body 169 may also include a mechanical connector 177 for coupling the vane 164 to a blind, in particular the head rail (not shown) of a blind. The body 169 may include a pair of electrical connectors (not shown) for connecting the terminals 179 of the circuitry 173 to the external circuit. In use, the vane 164 generates electrical power, by means of the solar panels 12, which is delivered to the external circuitry via the top component 171, and in particular via the terminals 179. The solar panels 12 are electrically connected in series.

In typical embodiments, a plurality of the vanes 164 are incorporated into a blind, usually by mechanically coupling the vanes 164 to a head rail (see FIG. 16) in any convenient manner. Preferably, at least some of the vanes 164 are electrically interconnected in order to combine their respective electrical power outputs. FIG. 9 illustrates how a plurality of vanes 164 may be electrically interconnected in parallel by connecting together terminals 179 with corresponding polarity (i.e. positive to positive and negative to negative). FIG. 10 illustrates how a plurality of vanes 164 may be electrically interconnected in series by connecting together terminals with opposite polarity (i.e. positive to negative). Conveniently, the respective top component 171 of each vane 164 can be electrically connected to the top component 171 of one or more adjacent vanes 164.

The circuitry 180 interconnecting the vanes 164 comprises part of the aforementioned external circuitry and serves to complete, in respect of at least some of the vanes 164, an electrical circuit comprising the respective circuitry 146 of each solar cell module 10, the circuitry 167 of the end component 165 and the circuitry 173 of the top component 171.

The external circuitry to which the vanes 164 are connected includes positive and negative terminals 182, 184 (FIG. 7) by which the combined electrical power generated by the vanes 164 may be delivered to an external device, in this case the inverter 66. In the case of vanes 164 being connected in parallel, any positive and negative terminal 179 of any of the vanes may serve as terminals 182, 184 respectively. In the case of the vanes 164 being connected in series, respective positive and negative terminals at either end of the series interconnection may serve as terminals 182, 184.

Figure 11:
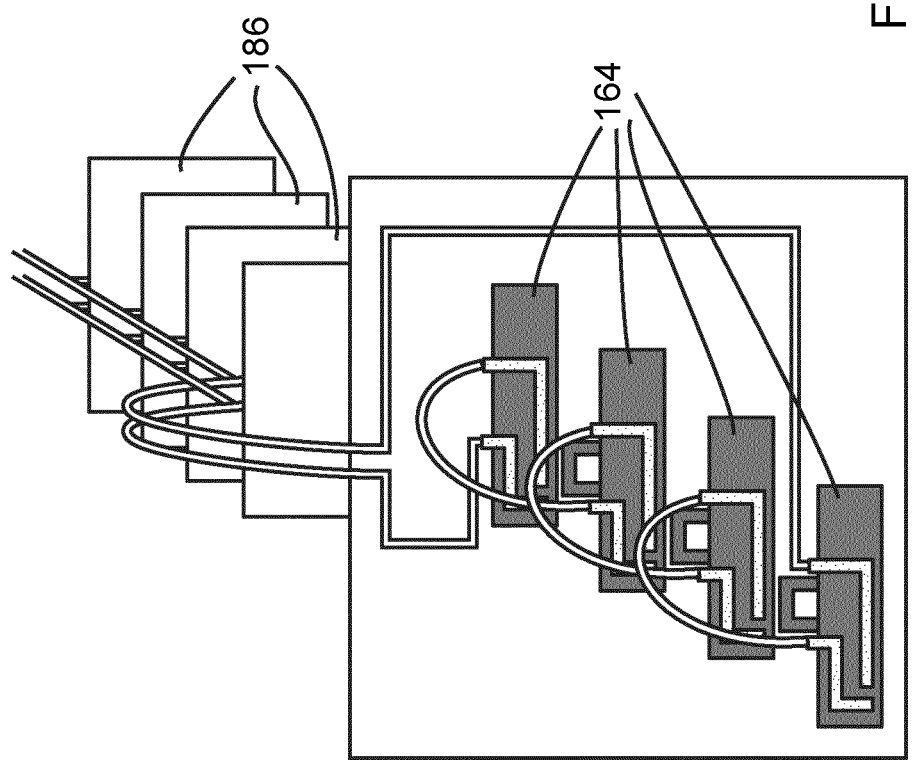
FIG. 11 is a schematic illustration of how a plurality of the blind vanes may be electrically interconnected in series and in parallel.

FIG. 11 shows how, within a blind, some vanes 164 may be connected in series and others in parallel. In the example of FIG. 11, a plurality of sets 186 of vanes are connected in parallel, each set 186 comprising a plurality of vanes 164 connected in series. Alternatively, the blind may comprise a plurality of sets of vanes connected in series, each set comprising a plurality of vanes connected in parallel.

The combined voltage and current levels output by the vanes 164 is dependent on how the vanes, and/or sets of vanes, are interconnected (series or parallel). The interconnection may be selected to suit a given application, for example where the electrical power is being delivered to a device, such as inverter 66, having voltage and/or current limits.

In alternative embodiments, solar electrical power generators 64 formed from interconnected modules may take forms other than vanes. For example, the generators 64 may comprise structures for forming a door, a building panel (e.g. roof or wall panel), a paving panel (e.g. for a ground surface), a shutter, or a windscreen sun shade. The foregoing, and following, description concerning the configuration of the generators 64 in the context of vanes 164 applies equally to other structures as would be apparent to a skilled person.

Figure 12:
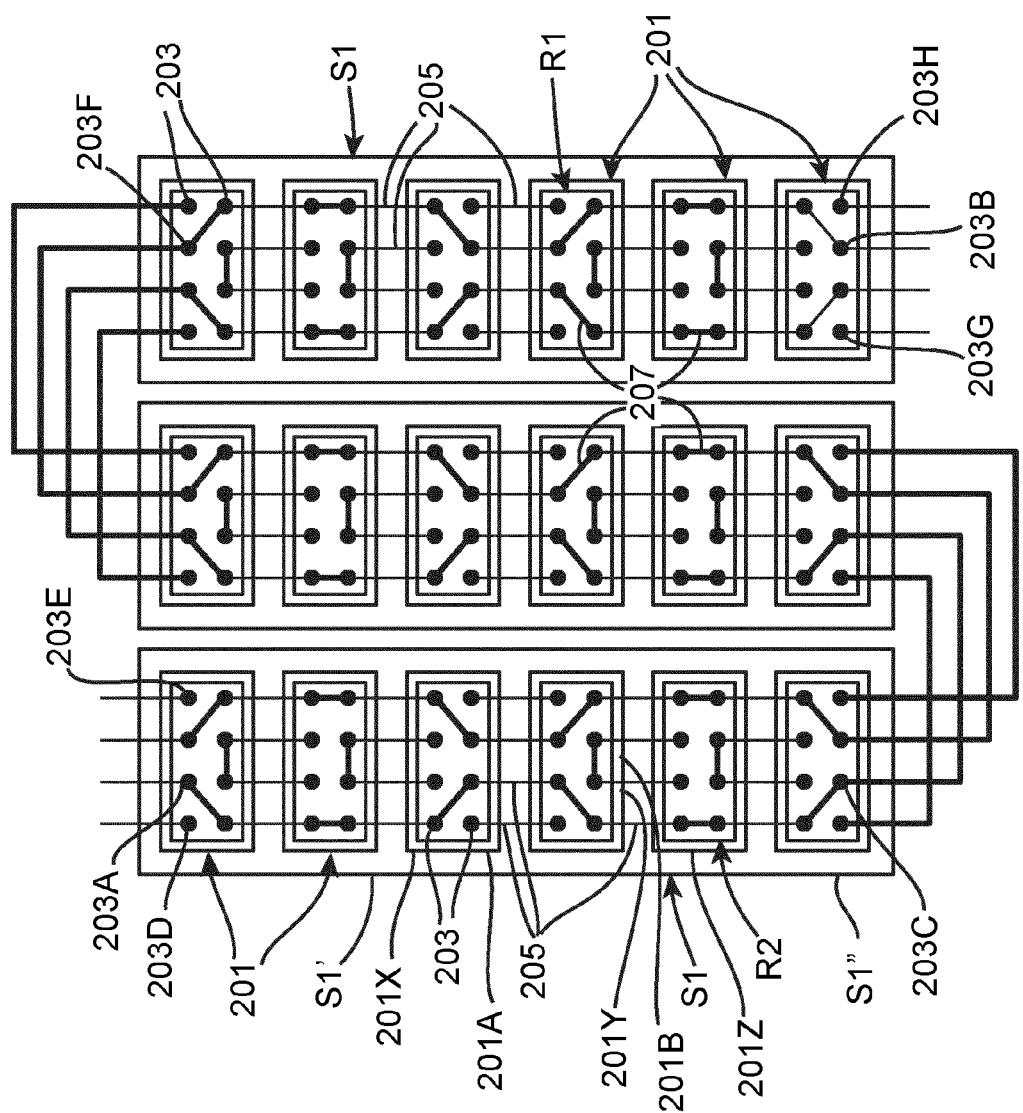
FIG. 12 is a top view of how a plurality of the blind vanes may be interconnected in series and in parallel using embodiments of an electrical connector embodying a still further aspect of the invention.

It is advantageous to simplify the electrical interconnection of the generators 64, 164. To this end, in preferred embodiments, each generator 64, 164 includes a multi-terminal electrical connector device 201, an embodiment of which is illustrated in FIG. 12. FIG. 12 shows, by way of example only, eighteen connector devices 201. Each connector 201 is assumed to be provided on, or otherwise associated with, a respective generator 64, 164 (viewed from the top in FIG. 12), although the connectors 201 may be used with any electrical device, e.g. a battery, having electrical terminals (typically a positive and a negative terminal). Each connector 201 has at least eight electrical terminals 203. The terminals 203 are preferably arranged in first R1 and second R2 rows of four, the rows R1, R2 preferably being aligned with one another. Most conveniently, the terminals 203 are arranged in a substantially rectangular two-dimensional array comprising rows R1, R2. One row R1 is positioned along one side of the connector 201, the other row R2 being positioned along the other side of the connector 201. The preferred arrangement is such that when connectors 201 are positioned adjacent one another, the first row R1 of one connector 201 is adjacent the second row R2 of another connector 201 and so on.

A first 203A and second 203B of the terminals 203 are electrically connected to a respective one of the output terminals of the generator 64, 164 (typically a positive output terminal and a negative output terminal). In the example of FIGS. 4 to 11, the terminals 203A and 203B may be connected to a respective one of the terminal pair 179 (e.g. in the case where the connector 201 is fitted to or otherwise included in or connected to the top component 171), or the terminal pair 42 of the end module 10 (e.g. in cases where the top component 171 is omitted or replaced by the connector 201).

In the preferred embodiment, the first terminal 203A is provided in the first row R1 and the second terminal 203B is provided in the second row R2. Advantageously, the terminals 203A, 203B are not aligned with one another, i.e. do not occupy the same row position. Preferably, they are offset from one another by one row position. Most preferably, the terminals 203A, 203B occupy a respective one of the two mid-row positions.

In the illustrated embodiment, the terminals 203 of each connector 201 adopt one of three preferred terminal configurations X, Y and Z, as exemplified by connectors 201X, 201Y and 201Z. In the first configuration adopted by connector 201X, the terminals 203B and 203C that occupy the mid-positions of the second row R2 are electrically connected, respectively, to the terminals 203D, 203E that occupy the closest end position of the first row R1. In the second configuration adopted by connector 201Y, the terminals 203A and 203F that occupy the mid-positions of the first row R1 are electrically connected, respectively, to the terminals 203G, 203H that occupy the closest end position of the second row R2, and the terminals 203B, 203C that occupy the mid-positions of the second row R2 are electrically connected together. In the third configuration adopted by connector 201Z, the terminals 203B, 203C that occupy the mid-positions of the second row R2 are electrically connected, and the terminals 203D, 203E occupying the end positions of one row R1 are electrically connected to a respective one of the terminals 203G, 203H occupying the adjacent, or closest, end positions of the other row R2.

By selective use of these terminal configurations, the terminals 203 of adjacent connectors 201 can be interconnected by connecting the terminals 203 of one row R1 or R2 of one connector 201 with the terminals 203 of the other row R2 or R1 of an adjacent connector 201 that occupy the same row position, independently of whether parallel or series interconnection of the associated generators 64, 164, or sets of generators 64, 164 is required. This is illustrated in FIG.

12 by four parallel connections 205 between adjacent connectors 201. This simplifies the installation of the generators 64, 164 (or other devices with which the connectors are used). In some cases, for example the connection of 203G to 203D and 203H to 203E where a 201X type connector 201 is connected to a 201Y type connector 201, one or more of the inter-connector terminal connections is redundant and may be omitted.

The terminal configurations X, Y, Z facilitate the connection of a plurality of individual generators 64, 164 or sets of generators 64, 164 in series or in parallel as desired, using the simplified "parallel" connection described above. For example, type Z connectors 201 can be connected in series with another type Z connector 201 on one or both sides and therefore are particularly suited to creating a string of generators 64, 164 connected in series. Type X and Y connectors 201 are particularly suited to creating parallel connections. For example a type X connector 201 may be provided at one end of a plurality (e.g. set) of generators 64, 164 to be connected in parallel with another one or more (e.g. set of) generators 64, 164, a type Y connector 201 being provided at the other end. Row R1 of a type Z connector 201 may be connected in series with row R2 of a type Y connector 201, while row R2 of a type Z connector 201 may be connected in series with row R1 of a type X connector 201. Hence, a set of two or more generators 64, 164 in series and for connection in parallel with one or more other generators 64, 164 or sets of generators 64, 164 may be created using a type X connector and a type Y connector with their respective R2 and R1 rows connected (if only two are required in the set), or one or more type Z connectors in series between a type X connector and a type Y connector.

This is illustrated in FIG. 12 where 6 sets S1 of generators 64, 164 are connected in parallel, each set S1 comprising 3 generators in series.

Figure 13:
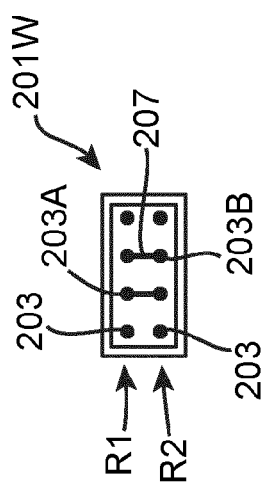
FIG. 13 is a top view of a further embodiment of the electrical connector.

FIG. 13 shows a top view of a connector 201W fourth terminal configuration W wherein two terminals 203 from one row R1, R2 are electrically connected to the respective terminal 203 in the other row R2, R1 that occupies the same terminal position. Preferably, the terminals 203 occupying the two mid-positions of each row R1, R2 are connected. Type W connectors 201 are particularly suited for connecting adjacent generators 64, 164 in parallel.

In FIGS. 12 and 13, terminals 203 are electrically connected using conductive links 207 as appropriate. Advantageously, the connectors 201 are configurable to adopt one or other of a plurality of terminal configurations, preferably including at least some of configurations W, X, Y and Z. In one embodiment, configuration and re-configuration of the connectors 201 may be performed manually by appropriate manual configuration of the links 207. Preferably, however, each connector 201 is co-operable with a switching apparatus (conveniently a respective switching apparatus) for effecting configuration and reconfiguration of inter-terminal connections of the connector 201.

Figure 18:
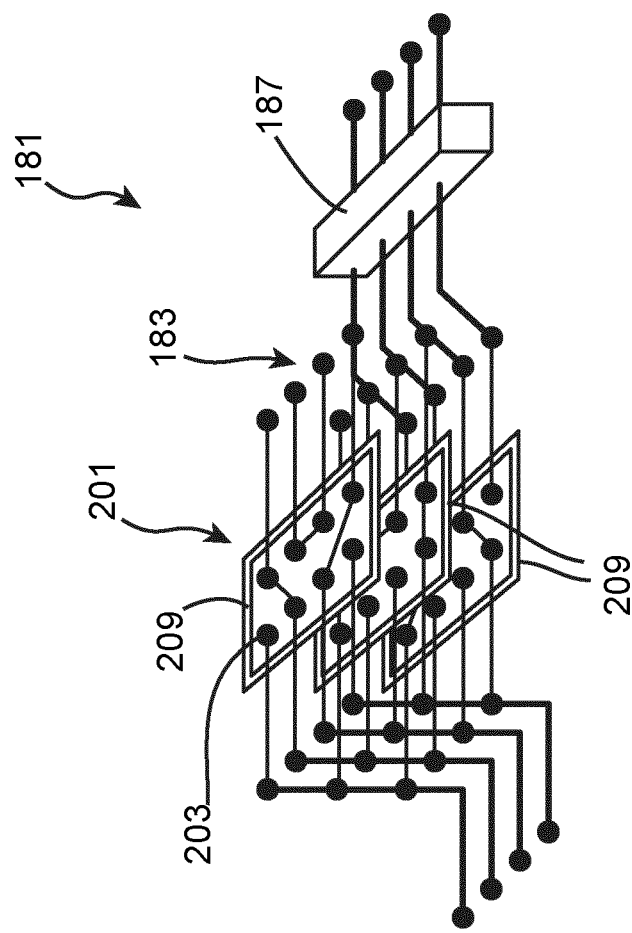
FIG. 18 is a schematic representation of a switching device.

FIG. 18 shows an example of a switching apparatus 181 comprising a switch 183 and a switch controller 187. The switch 183 has a respective switch position for each terminal configuration (X, Y and Z in this example) and adopts one or other of the positions under control of the controller 187. In this example, it is assumed that each connector 201 comprises a respective terminal block 209 for each terminal configuration that it can adopt, each terminal block 209 comprising the terminals 203 interconnected according to the respective configuration. A respective one of the blocks 209 is brought in-circuit when the switch 183 adopts the respective switching position. In this example, the switch 183 is a four pole switch to match the number of terminals in each row R1, R2.

Alternative switching apparatus (not illustrated) may be used, for example a multi-terminal micro-switch configurable to interconnect its terminals in response to a signal from a controller; or a multi-terminal mechanical switch having a user operable input device (e.g. a slide) capable of adopting any one of multiple settings, each setting causing a respective terminal configuration to be adopted. In such cases, separate terminal blocks for each configuration are not necessary.

In preferred embodiments, a controller 185 (FIG. 7) is provided for controlling the configuration of at least some of the connectors 201 of a system comprising at least one and typically a plurality of generators 64, 164. The controller 185 may for example comprise a suitably programmed processor (e.g. microprocessor or microcontroller) or logic device. The controller 185 is configured to monitor one or more system parameters and to set the configuration of one or more connectors 201 accordingly. The system parameters may include a measure of the amount of solar energy being received by the generators 64, 164 and/or an indication of the voltage level and/or current level being produced by the or each (individually and/or combined) generator 64, 164. For example, in FIG. 7, controller 185 is connected to the output of the generators 64 for this purpose. Depending on the determined level of solar energy being received, the controller 185 may configure one or more connectors 201 to increase or decrease the voltage or current being produced, individually and/or in combination, by the generators 64, 164. Alternatively, or in addition, depending on the determined level of voltage and/or current being produced by the or each (individually and/or combined) generator 64, 164, the controller 185 may configure one or more connectors 201 to increase or decrease the voltage or current being produced, individually and/or in combination, by the generators 64, 164.

This is particularly useful in embodiments where the output of the generators 64, 164 is supplied to a device, e.g. inverter 66, that requires the received electrical power to comply with voltage and/or current limits.

For example, with reference to FIG. 12, sets S1' and S1" are shown connected in parallel. By reconfiguring connectors 201A and 201B such that they are each type Z connectors 201, all of the generators 64, 164 in sets S1' and S1" would be connected in series. This would have the effect of increasing the combined voltage produced by the generators of these sets.

Figure 14:
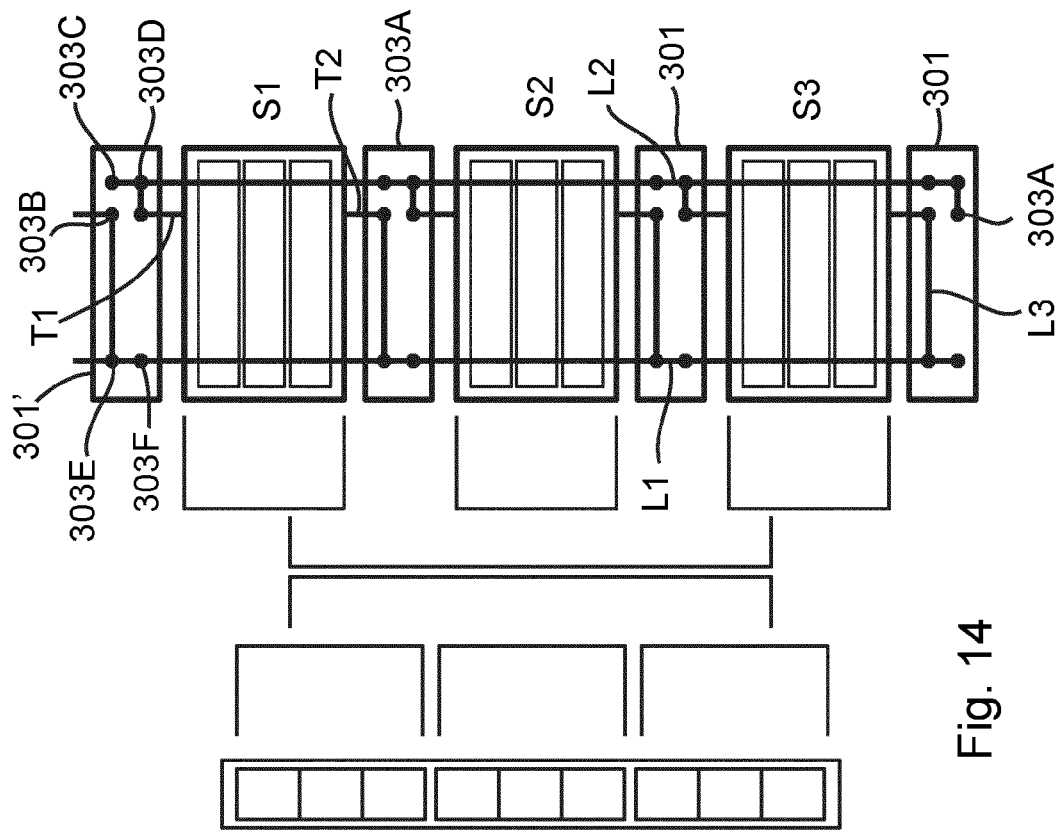
FIG. 14 is a schematic illustration of how a plurality of solar modules of the first aspect of the invention may be electrically interconnected in series and in parallel to form a blind vane.

It can be advantageous to interconnect generators 64, 164 or solar cell modules 10 using connectors that are configured or configurable to allow adjacent generators or sets of generators to be interconnected or selectively interconnected in series or in parallel. An example of such a connector is shown in FIG. 14, indicated as 301. FIG. 14 shows a plurality of connectors 301 interspersed between a plurality of sets S1, S2, S3 of solar cell modules 10, each set containing 3 modules by way of example only (each set could alternatively comprise one or more modules). A respective connector 301 is provided at each end of the string of sets S1, S2, S3, and a further respective connector 301 is provided between each pair of adjacent sets.

In the example of FIG. 14, each set comprises one or more solar cell modules 10 and, as such, the sets may together comprise a vane 164 or other generator 64. Alternatively, each set may comprises one or more generators 64, 164, or any electrical device, e.g. a battery, having electrical terminals (typically a positive and a negative terminal).

In the preferred embodiment, each connector 301 has at least six electrical terminals 303. The terminals 303 are preferably arranged in first R1 and second R2 rows of three, the rows R1, R2 preferably being aligned with one another. Most conveniently, the terminals 303 are arranged in a substantially rectangular two-dimensional array comprising rows R1, R2. One row R1 is positioned along one side of the connector 301, the other row R2 being positioned along the other side of the connector 301. The preferred arrangement is such that when connectors 301 are positioned adjacent one another, the first row R1 of one connector 301 is adjacent the second row R2 of another connector 301 and so on.

Each set S1, S2, S3 has first and second terminals T1, T2 between which the respective modules 10 (or other devices) of the set are connected in series. The connector 301 has a first terminal 303A for electrical connection to a respective first terminal T1 of a module 10 of a first set, and a second terminal 303B for electrical connection to a respective second terminal T2 of a second set that is adjacent the first set. The first and second terminals 303A, 303B are preferably in different rows R1, R2 and are conveniently aligned with one another, i.e. occupy the same row position. The connector 301 has third and fourth terminals 303C, 303D, the fourth terminal 303D of a first connector 301 being electrically connected in use to the third terminal 303C of the next connector 301. The third and fourth terminals 303C, 303D are preferably in different rows R1, R2 and are conveniently aligned with one another, i.e. occupy the same row position. The connector 301 has fifth and sixth terminals 303E, 303F, the sixth terminal 303F of a first connector 301 being electrically connected in use to the fifth terminal 303E of the next connector 301. The fifth and sixth terminals 303C, 303D are preferably in different rows R1, R2 and are conveniently aligned with one another, i.e. occupy the same row position. In this embodiment, the fifth and second terminals 303E, 303B are electrically connected together, and the first and fourth terminals 303A, 303D are electrically connected together.

FIG. 14 shows the connectors 301 in a first configuration wherein the fifth and sixth terminals 303E, 303F are electrically connected together, the third and fourth terminals 303C, 303D are electrically connected together and the second and fifth terminals 303B, 303E are electrically connected together, e.g. by links L1, L2 and L3 respectively. In this configuration, the respective first terminals T1 of each set S1, S2, S3 are electrically connected together (by virtue of links L2) and the respective second terminals T2 of each set S1, S2, S3 are electrically connected together (by virtue of links L1 and L3). As such, the sets S1, S2, S3 are connected in parallel. In some embodiments, the connectors 301 are fixed in the first configuration and so perform the function of electrically configuring a physical series of modules 10, or other units, in parallel groups of units in series. This is particularly advantageous in cases where the structure, e.g. blind 164, being formed from the unitsmodules 10 is required to be long, i.e. to comprises a relatively large number of interconnected unitsmodules, and it is desired to maintain the electrical power output within system limits.

In a second configuration (not illustrated), links L2 are removed and the respective first and second terminals 303A, 303B of each connector 301 are electrically connected together. Link L3 is removed in all but the last connector 301" in the string. Now, the sets S1, S2, S3 are connected in series.

In some embodiments, the connectors 301 may be configurable to adopt one of at least two configurations, e.g. the first and second configurations described above. This may be achieved by any suitable switching means, e.g. a switching apparatus of the type of FIG. 18.

It will be understood, that the respective connectors 301 may be configured differently such that, within a sequence of sets, some sets are connected in series while others are connected in parallel.

One of the end connectors 301' may be configured for connection to an external circuit, e.g. via terminals 303B and 303E, and may for example be incorporated into end component 171 (FIG. 8) to provide end terminals 179. For connection convenience, terminals 303C and 303B may be electrically interconnected.

In alternative embodiments (not illustrated) the fifth and sixth terminals may be replaced by a single terminal and the first and fourth terminals may be replaced by a single terminal.

The terminals 303 may be manually configurable or configurable using a switching device, in the same or similar manner described above in relation to the connector 201.

As before, configurations may be selected to suit the desired current or voltage output. For example, in comparison with a configuration in which all of the sets are connected in series, the configuration shown in FIG. 14 produces a higher current and a lower voltage, but the same power.

Figure 17:
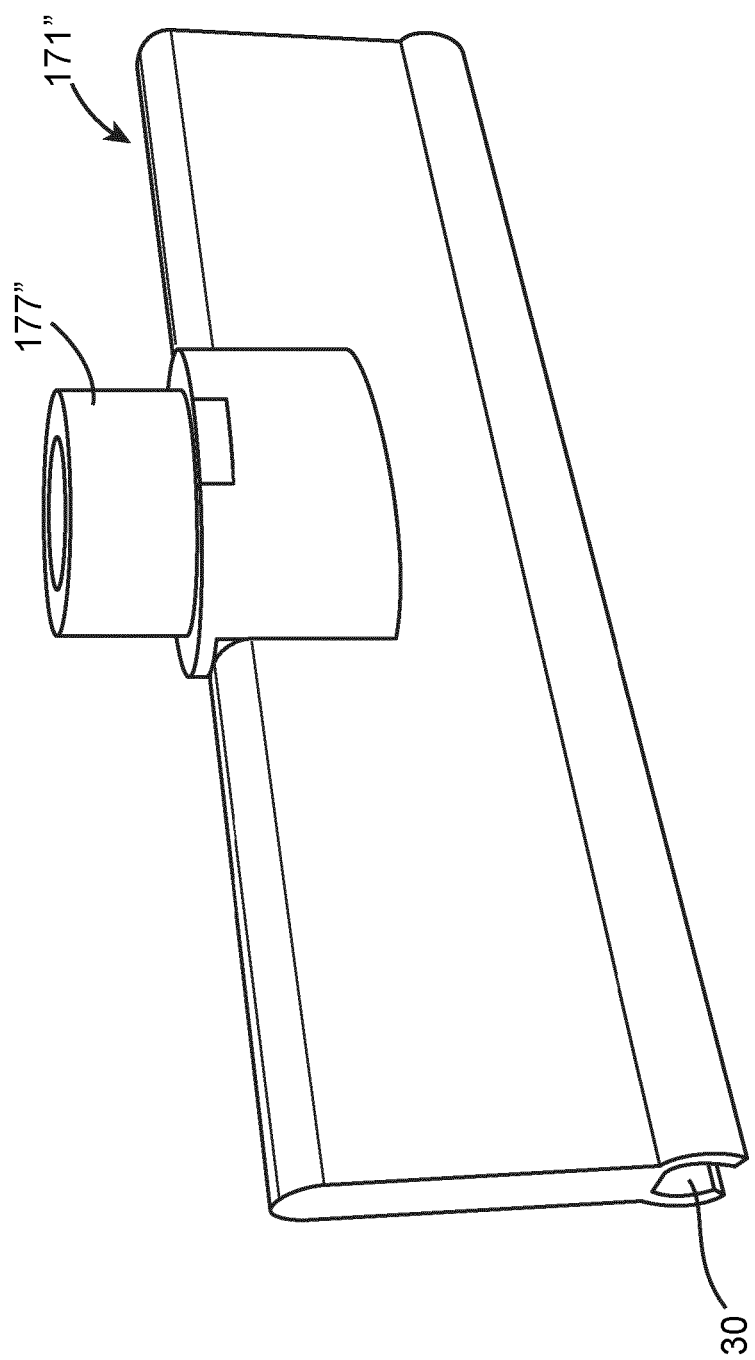
FIG. 17 is a perspective view of a preferred embodiment of the top block of FIG. 15.

FIG. 15 shows a preferred top component 171' including a mechanical connector 177' for connection to a head rail of a blind. The component 171' and connector 177' are configured to incorporate the electrical wires, and optionally also the connector 201, for connecting the vane 164 to the system 60. To this end, the component 171' and connector 177' may comprise a hollow body. By way of example, FIG. 17 shows an embodiment of the top component 171" including a hollow connector 177" which contains, in use, a connector 201 (not shown), optionally with switch 181, typically incorporated into a body adapted to fit, preferably removably, within the connector 177". The top component 171" has a male or female (as appropriate female illustrated) mechanical connector 30 for removably connecting to a module 10 or connector 301 as applicable. The connector 201 is electrically connectable to the terminals 42 (not shown in FIG. 15) of the module 10 or connector 301 by internal circuitry 173 (see FIG. 8). To this end, the mechanical connector 30 has suitable electrical terminals (not visible). The terminals 203 of the connector 201 may be exposed by an open mouth of the connector 177" to allow the connector 201 to be connected to another connector 201 or circuit as applicable.

FIG. 16 shows how an enclosure 195 may be provided on a head rail 197 of a blind 199 for housing one or more components of the system 60, e.g. the inverter 66. The enclosure 195 may also house a fan (not shown) for cooling components in the enclosure 195.

Figure 19:
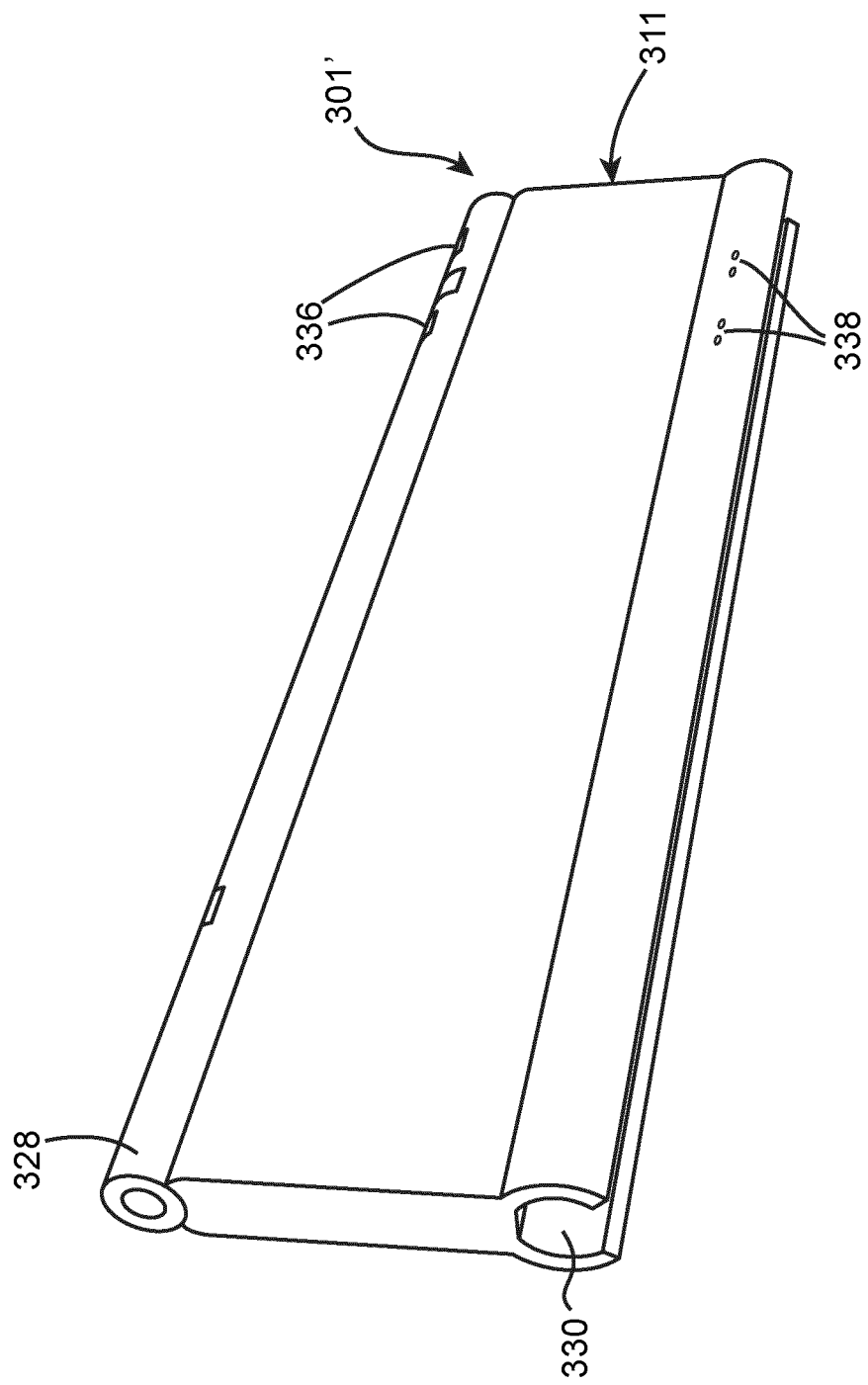
FIG. 19 is a perspective view of a connector module for interconnecting solar modules.

FIG. 19 illustrates an embodiment 301' of the connector 301 incorporated into a connector module 311 having a respective one of co-operable mechanical connectors 328, 330 provided at first and second opposite ends. Typically one connector 328 is a male connector and the other connector 330 is a corresponding female connector. Hence, the connector 301' can be releasably connected to one or more modules 10 (as illustrated in FIG. 14 for example) or other units with compatible connectors. The electrical circuitry of the connector 301 is incorporated into the connector module 311 and the mechanical connectors 328, 330 are provided with electrical connectors 336, 338 for electrically connecting to a mechanically connected component, e.g. module 10.

Figure 20:
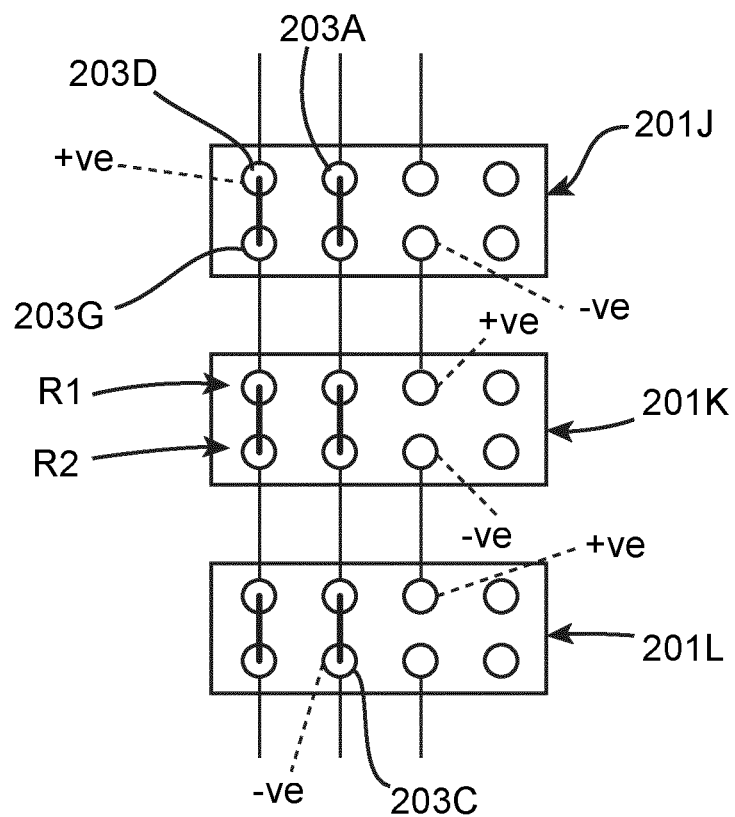
FIG. 20 is a top view of three of the electrical connectors of FIG. 12 in an alternative configuration.

FIG. 20 illustrates three (by way of example) of the multi-terminal electrical connector devices 201 in alternative configurations to those presented in FIG. 12. FIG. 20 shows the connectors 201 in a type U configuration in which only three terminals 203 in each row R2, R2 are used. The spare terminals (the rightmost terminals in FIG. 20) may be omitted in which case the connector 201 would have only six terminals 203. First and second terminals, in this example the first two terminals 203D, 203A and 203G, 203C, in each row R1, R2 are electrically connected to the terminals in the other row R2, R1 with corresponding row position (terminals 203G, 203C and 203D, 203A in this example). The respective third terminals in each row are not connected to each other. The type U connectors 201 can be made to provide the same connectivity as the connectors 201 shown in FIG. 12. For example, the three connectors 201 shown in FIG. 20 are configured to provide the same connectivity as the individual sets S1 of FIG. 12, and may be similarly reconfigured or extended by the introduction of one or more like intermediate connectors 201, as would be apparent to a skilled person.

To achieve this connectivity, the connection of each connector 201 to the respective electrical terminals of the generator 64, 164, or other electrical device, to which it is connected in use is different to that described in relation to FIG. 12. In FIG. 20, the respective external terminal connections are shown as "+ve" and "−ve" (although the polarity could be reversed from that which is illustrated). For the first connector 201J of the set one of the first or second terminals of the first row R1 is connected to the positive (or negative) external terminal while the third terminal of the second row R2 is connected to the negative (or positive) external terminal. For the (or each) intermediate connector 201K of the set, the third terminal of the first row R1 is connected to the positive (or negative) external terminal while the third terminal of the second row R2 is connected to the negative (or positive) external terminal. For the last connector 201L of the set the third terminal of the first row R1 is connected to the positive (or negative) external terminal while the other (with respect to the connectivity of the first row of the first connector 201J) of the first or second terminals of the second row R2 is connected to the negative (or positive) external terminal. As a result three parallel connections can be made between adjacent connectors and this simplifies the installation process and reduces material requirements.

Figure 21:
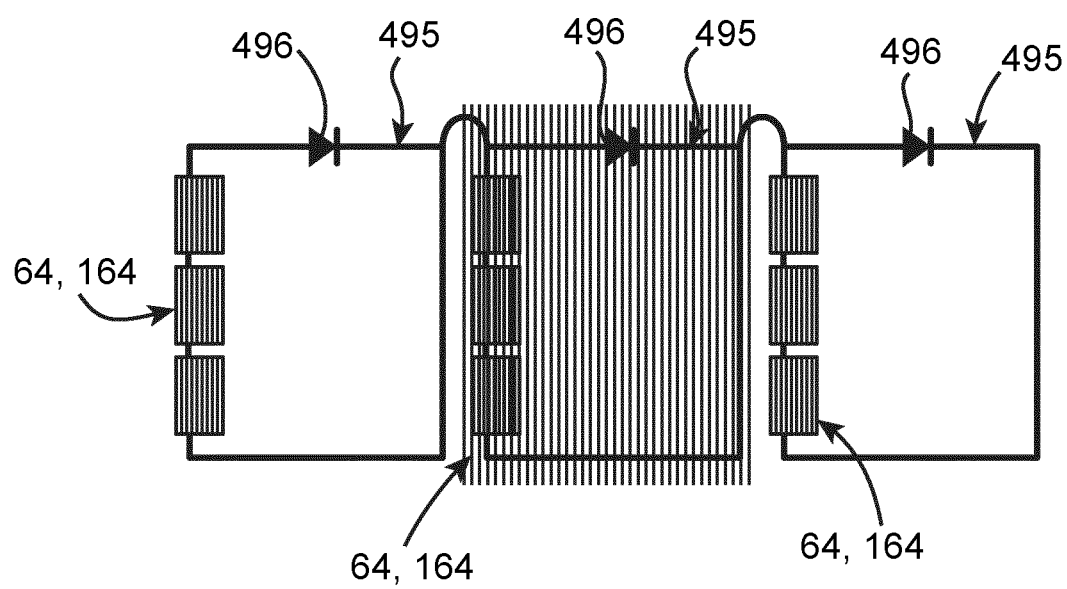
FIG. 21 is a schematic view of a plurality of sets of electrical generators, for example blind vanes, interconnected by a respective bypass diode.

FIG. 21 shows a plurality of sets of one or more generators 64, 164 connected in series. A respective bypass circuit 495 is provided from the input 491 to the output 493 of each set. When the circuit 495 is active, the respective set is bypassed so that the current generated from the preceding set is fed to the following set, bypassing the intermediate bypassed set. It may be desirable to bypass a set of solar generators 64, 164 that are in shade since it tends to exhibit a relatively high resistance in such conditions. Conveniently, each bypass circuit may comprise a diode 496 selected and arranged such that current from the preceding set takes the bypass circuit if the resistance of the bypassed set exceeds a threshold level. Alternatively, the bypass circuit may be activated by a switch (not illustrated).

The invention is not limited to the embodiments described herein which may be modified or varied without departing from the scope of the invention.

The invention claimed is:
1. An electrical connection system comprising:
a plurality of electrical components each having a positive electrical terminal and a negative electrical terminal;
a plurality of electrical connector devices that interconnect the plurality of electrical components, wherein each electrical connector of the plurality of electrical connector devices includes:
a first row of electrical connector terminals positioned along a first side of the respective electrical connector device, said first row comprising a first of said electrical connector terminals and a fourth of said electrical connector terminals each located at a respective end of said first row, and a second of said electrical connector terminals and a third of said electrical terminals located between said first and fourth electrical connector terminals; and
a second row of electrical connector terminals positioned along a second side of the respective electrical connector device, said second row comprising a first of said electrical connector terminals and a fourth of said electrical connector terminals each located at a respective end of said second row, and a second of said electrical connector terminals and a third of said electrical terminals located between said first and fourth electrical connector terminals, wherein:
the second of said electrical connector terminals of said first row is electrically connected by an electrically conductive link to one of said positive and negative electrical terminals of the respective electrical component, and the third of said electrical connector terminals of said second row is electrically connected by an electrically conductive link to the other of said positive and negative electrical terminals of the respective electrical component; and
each of said electrical connector devices is electrically connected to at least one other of said electrical connector devices by at least two respective electrically conductive links connected between at least two respective electrical terminals of each respective electrical connector device; and
a switching apparatus for each of said electrical connector devices, the respective switching apparatus being operable to physically and electrically connect said electrical connector terminals of said first and second rows of the respective electrical connector device in accordance with a selected one of a plurality of configurations comprising:
a first configuration in which said second and third electrical connector terminals of the second row are physically and electrically connected to the first and fourth electrical connector terminals, respectively, of the first row;
a second configuration in which the second and third electrical connector terminals of the first row are physically and electrically connected to the first and fourth electrical connector terminals, respectively, of the second row, and the second and third electrical connector terminals of the second row are physically and electrically connected together; and
a third configuration in which said second and third electrical connector terminals of the second row are physically and electrically connected together, and the first and fourth electrical connector terminals of the first row are physically and electrically connected the first and fourth electrical connector terminals, respectively, of the second row, wherein each of said electrical components comprises an electrical solar power generator.

2. An electrical connection system as claimed in claim 1, including at least one first type of set of said electrical components, each instance of said first type of set comprising at least two of said electrical components each having a respective one of said electrical connector devices with said third configuration, said at least two electrical components being connected in series electrically.

3. An electrical connection system as claimed in claim 2, including at least one second type of set of said electrical components, each instance of said second type of set including a first electrical component having a connector device with said first configuration and a second electrical component having a connector device with said second configuration said first and second electrical components being connected in series electrically.

4. An electrical connection system as claimed in claim 3, including at least one instance of a first and second of said second type of set, each instance being arranged with the connector device of the second electrical component of the first of said second type of set electrically connected by a respective electrically conductive link to the connector device of the first electrical component of the second of said second type of set.

5. The system of claim 3, wherein each instance of said second type of set includes at least one of said electrical components connected between said first and second electrical components, the respective electrical connector device of said at least one of said electrical components having a connector device with said third configuration.

6. An electrical connection system as claimed in claim 1, including a plurality of sets of one or more of said electrical solar power generators, each electrical solar power generator in a set being connected electrically in series with each other electrical solar power generator in the set, or being connected electrically in parallel with each other electrical solar power generator in the set, each set being connected electrically in series with one or more other sets, and/or in parallel with one or more other sets.

7. An electrical connection system as claimed in claim 1, further including a controller configured to monitor at least one system parameter and to operate said switching apparatus depending on said at least one system parameter.

8. An electrical connection system as claimed in claim 7, wherein said at least one system parameters include a measure of the amount of solar energy being received by the electrical solar power generators.

9. An electrical connection system as claimed in claim 8, wherein depending on a determined level of solar energy being received in use, the controller is arranged to set said configurations to increase or decrease the voltage or current being produced by the electrical solar power generators.

10. An electrical connection system as claimed in claim 8, wherein depending on a determined level of voltage or current being produced by the electrical solar power generators in use, the controller is arranged to configure said configurations to increase or decrease the voltage or current being produced by the electrical solar power generators.

11. An electrical connection system as claimed in claim 1, comprising a blind having at least one vane, wherein said at least one vane comprises a respective one of said electrical solar power generators.

12. An electrical connection system as claimed in claim 11, wherein said at least one vane includes a mechanical connector for connecting said at least one vane to a head rail of said blind.

13. An electrical connection system as claimed in claim 1, wherein each electrical solar power generator comprises at least one solar cell module, at least one solar cell module comprising:
a solar panel;
at least one mechanical connector for releasably connecting said at least one solar cell module to a second at least one solar cell module;
electrical circuitry electrically connected to a solar panel of the electrical solar power generator to receive electrical current generated by the panel in use; and
at least one electrical connector configured to enable electrical interconnection of said electrical circuitry with the electrical circuitry of one or more other instances of said at least one solar cell module, wherein said at least one electrical connector comprises said positive and negative electrical terminals.

14. An electrical connection system as claimed in claim 13, wherein said at least one solar cell module comprises a multi-layer structure in which said solar panel and said electrical circuitry are incorporated between at least two electrically insulating layers.

15. An electrical connection system as claimed in claim 13, wherein said at least one solar cell module is substantially planar in shape.

16. An electrical connection system as claimed in claim 13, wherein said at least one solar cell module includes at least two mechanical connectors spaced apart on the at least one solar cell module for releasably mechanically connecting the module to the one or more other instances of said solar cell module.

17. An electrical connection system as claimed in claim 13, wherein said electrical circuitry is configured such that, when connected to the one or more other instances of said at least one solar cell module, the solar panel of said at least one solar cell module is connected in electrical series with a respective solar panel of the one or more other instances of the at least one solar cell module.

18. The electrical connection system of claim 1 wherein said plurality of configurations includes a fourth configuration in which said second and third electrical connector terminals of said first row are physically and electrically connected, respectively, to said second and third electrical connector terminals of said second row.

* * * * *